(12) United States Patent
Johnstone et al.

(10) Patent No.: US 7,265,700 B2
(45) Date of Patent: Sep. 4, 2007

(54) METHOD AND APPARATUS FOR EXTRACTING INDIVIDUAL PULSES FROM AN INPUT SIGNAL

(75) Inventors: Colin Johnstone, Fife (GB); Eric Breakenridge, Alloa (GB)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 11/475,331

(22) Filed: Jun. 27, 2006

(65) Prior Publication Data

US 2007/0001887 A1 Jan. 4, 2007

(30) Foreign Application Priority Data

Jun. 29, 2005 (GB) .................................. 0513147.9

(51) Int. Cl.
H03M 1/60 (2006.01)
(52) U.S. Cl. ........................ 341/157; 341/155; 341/177
(58) Field of Classification Search ................ 341/155, 341/157, 177, 183
See application file for complete search history.

(56) References Cited

U.S. PATENT DOCUMENTS 4,905,003 A * 2/1990 Helferich ..................... 341/110
5,790,603 A * 8/1998 Maeda et al. ................ 375/342
5,930,691 A * 7/1999 Zeng ........................ 455/186.1
6,281,820 B1 * 8/2001 Fields ......................... 341/137
6,621,443 B1 * 9/2003 Selli et al. ................... 341/155
6,774,835 B1 * 8/2004 Cloetens ..................... 341/155
6,975,251 B2 * 12/2005 Pavicic ......................... 341/50
7,088,794 B2 * 8/2006 Nichols ....................... 375/345
7,142,140 B2 * 11/2006 Storvik et al. .............. 341/141
2006/0220938 A1 * 10/2006 Leung et al. ................ 341/155

FOREIGN PATENT DOCUMENTS

EP 1672794 A2 6/2006
JP 4072518 A 3/1992

OTHER PUBLICATIONS

UK Search Report for GB0513147.9 dated Nov. 8, 2005.

* cited by examiner

Primary Examiner—Linh Nguyen
(74) Attorney, Agent, or Firm—Marc Bobys

(57) ABSTRACT

Digital samples corresponding to a pulsed input signal are provided from an ADC to a memory for storage and to a pulse extraction circuit. The pulse extraction circuit detects the leading and trailing edges of pulses in the input signal. The digital samples are stored in both a Current memory buffer and a Next memory buffer. When a pulse trailing edge is detected, the Current buffer is stopped from storing further samples, the Next buffer becomes the Current buffer and a new buffer becomes the Next buffer. Digital data samples are then provided from the (previous) Current buffer after it has stopped storing samples.

19 Claims, 6 Drawing Sheets

METHOD AND APPARATUS FOR EXTRACTING INDIVIDUAL PULSES FROM AN INPUT SIGNAL

PRIORITY CLAIM

Foreign priority rights under Title 35, United States Code Section 119, to Great Britain Application Number 0513147.9, filed Jun. 29, 2005, are hereby claimed.

The present invention relates to a method and apparatus for extracting individual pulses from an input signal, especially, though not exclusively for extracting individual pulses that may be heavily modulated and/or pulses in a noisy signal.

BACKGROUND

With the rapid growth of wireless telecommunication systems, system providers are challenged to provide quality radio frequency (RF) signals with maximum coverage. In a wireless telecommunications system, a mobile phone needs to be calibrated to provide the power necessary to reach the base station. On the other hand, in order to conserve battery life, the power transmitted should not be more than what is needed. The mobile phone must be able to tune the output power for an optimum connection. Also, the base station and mobile phone must not exceed the maximum allowable power transmitted according to government standards and regulations. Therefore, assuring that the transmitted power does not exceed the allowable limit, which is traced to a known standard, is a primary concern. Thus, accurate power measurements are important for maintaining a high quality connection in modern telecommunication systems.

As with many other types of signals, an RF signal can be made up of a sequence of pulses. In the case of a pulsed RF power signal, the pulses have a leading rising edge and a trailing falling edge. The power envelope of the RF signal is, in some cases, determined by the RF signal's modulation type. In order to measure, for example, the average transmitted power, it is necessary to identify each pulse and to measure particular parameters of each pulse individually. However, in Wireless LAN applications, the pulses may not be of the same width, making their identification and measurement quite difficult. Furthermore, if a pulse is not an exact predetermined fixed distance from a trigger point, it may, again, be difficult to locate, particularly over a relatively long timescale without any pulses. If repetitive pulses are to be measured, then it is almost impossible to do so if they vary in position relative to the trigger point.

In other cases, the pulses within a sequence may have different characteristics from others in the sequence, for example because of the amplifiers used in the generation of the pulses heat up. Measurement of the differences is then necessary in order to make sure that all the pulses remain within the required parameters.

In known circuitry for extracting individual pulses from a sequence of pulses, which may occur irregularly, the whole sequence, or at least a large part thereof, has first been captured into memory and then, subsequently, processed to look for the pulses and perform measurements on them. A fair amount of time can therefore be wasted on processing the non-pulsed information. Furthermore, extracting and delineating the pulses can be algorithmically complex in the presence of strange-shaped or modulated pulses. The main disadvantage of this technique is that the memory will have a finite size. If the pulses are too far apart from each other then they will either be missed or the sampling rate of the Analog to Digital Converter (ADC) used for digitising the analog input signal would need to be reduced in order to sample over a longer period of time. The disadvantage of the latter is that the measurement resolution is reduced. It may, in the worst case, sample at a rate less that the pulse width resulting in only one or even no samples of the desired pulse.

In other known techniques, in order to save on memory, the spaces between pulses are not stored. This allows the pulses themselves to be captured at maximum data rates, but, clearly, they need to be accurately extracted for capture. However, in order to process a pulse, it is necessary to know what the signal was doing before the front edge trigger point and what it does after the back edge trigger point. An example of where this is necessary is in the determination of pulse edge rise and fall time measurement. For two pulses that are very close together, the trailing edge of one pulse may form part of the leading edge of the next pulse. In such cases, the determination of the trailing edge of the first pulse may occur after the leading edge of the next pulse has passed. If this happens, then the second pulse may not be captured properly, or at all, because its existence would not be looked for until after the trailing edge of the previous pulse is detected.

BRIEF DESCRIPTION OF DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
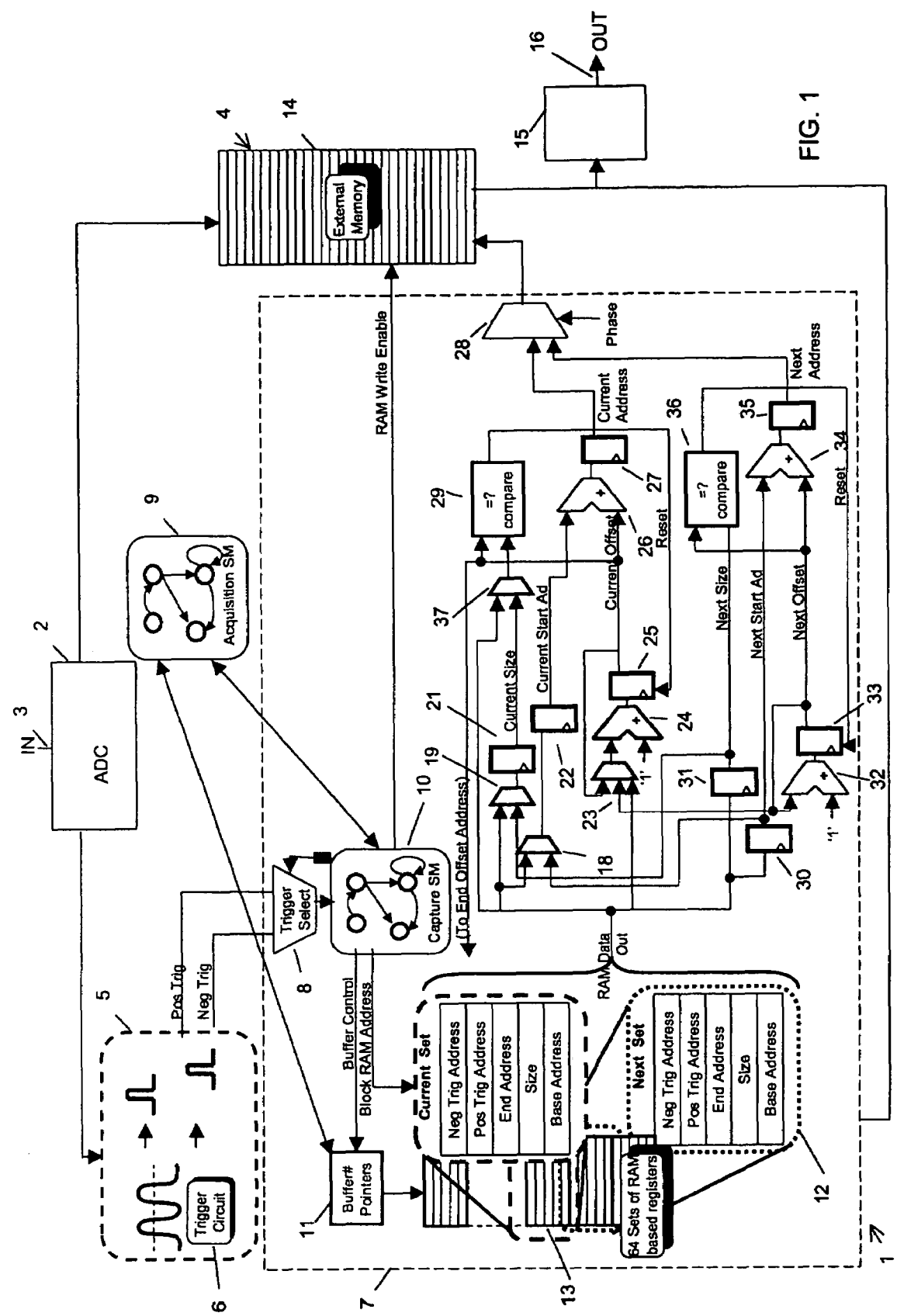
FIG. 1 shows a schematic block diagram of an apparatus consistent with certain embodiments of the present invention.

The present invention therefore seeks to provide a method and apparatus for extracting individual pulses in a signal, especially, though not exclusively for detecting leading edges of heavily modulated pulses and/or pulses in a noisy signal, which overcomes, or at least reduces the above-mentioned problems of the prior art.

Accordingly, certain embodiments of the invention provide an apparatus for extracting individual pulses from an input signal, the apparatus comprising an input terminal for receiving an input signal comprising a stream of pulses, an analog to digital converter (ADC) having an input coupled to the input terminal for receiving the input signal, the ADC converting the received input signal into digital data samples, and an output for providing the digital data samples, memory comprising a plurality of logically separate memory buffers coupled to the output of the ADC for storing the digital data samples, a pulse extraction circuit having an input coupled to the output of the ADC for detecting leading and trailing pulse edges in the digital data samples and an output, a memory buffer controller coupled to the output of the ADC, the memory and the output of the pulse extraction circuit for controlling storage of the digital data samples in the memory, wherein the digital data samples are stored into at least two memory buffers such that the digital data samples are stored into at least a current buffer and a next buffer, and wherein, when a pulse trailing edge is detected in the current buffer, that current buffer is stopped from storing further digital data samples and the next buffer becomes the current buffer with a new buffer becoming the next buffer, and an output terminal for providing the digital data samples from the current buffer after it has stopped storing further digital samples.

The apparatus may further comprise waveform processing circuitry coupled to the output terminal for receiving the digital data samples relating to a detected pulse from a memory buffer that has been stopped from storing further digital data samples, that memory buffer then becoming available to become a next buffer.

The pulse extraction circuit may comprise a controller, first and second hysteresis threshold comparators each having a first input for receiving the digital data samples, a second input for receiving first and second hysteresis threshold values and an output coupled to the controller, wherein the first and second hysteresis threshold comparators compare the digital data samples with first and second hysteresis threshold levels, respectively, first and second qualification timers, each being controlled by the controller and having a time out output coupled to the controller, wherein the controller receives the outputs of the comparators and the timers and controls starting of the timers to enable the controller to determine whether a transition of the digital data samples across a hysteresis threshold level constitutes a leading pulse edge or not, and whether a transition of the input signal across a hysteresis threshold level constitutes a trailing pulse edge of the input signal or not.

The current buffer may be stopped from storing further digital data samples after a time delay after the pulse trailing edge is detected in the current buffer. The memory buffer controller may comprise a plurality of registers each for storing information relating a particular extracted pulse.

In one embodiment consistent with the invention, the data may be stored in the at least two memory buffers in a time-multiplexed manner.

The information stored in the register relating to a particular pulse may include at least timing information and memory address information and/or a pulse number, the pulse numbers being incremented each time a new pulse is extracted.

The memory buffer controller may include an input for receiving control information for controlling the memory buffers to store only predetermined pulses according to their pulse number.

The apparatus may further comprise an acquisition circuit having an input coupled to the output of the pulse extraction circuit and an output coupled to the memory buffer controller, the acquisition circuit including a timer for enabling the memory buffer controller a predetermined time after a pulse edge is detected.

According to certain other embodiments consistent with the invention provides a method of extracting individual pulses from an input signal, the method comprising receiving an input signal comprising a stream of pulses, converting the received input signal into digital data samples, detecting leading and trailing pulse edges in the digital data samples, storing the digital data samples into at least two memory buffers such that the digital data samples are stored into at least a current buffer and a next buffer, and wherein, when a pulse trailing edge is detected in the data samples being stored in the current buffer, that current buffer is stopped from storing further digital data samples and the next buffer becomes the current buffer with a new buffer becoming the next buffer, and outputting the digital data samples from the current buffer after it has stopped storing further digital samples.

The method may further comprise processing the digital data samples output from a memory buffer that has been stopped from storing further digital data samples, that memory buffer then becoming available to become a next buffer.

Detecting leading and trailing pulse edges may comprise starting a first qualification timer when a first transition of the digital data samples across a first hysteresis threshold is detected starting a second qualification timer when a transition of the digital data samples across a second hysteresis threshold is detected whilst the first qualification timer is timing, and validating the first transition as a leading edge of a pulse of the input signal if the digital data samples are above the first hysteresis threshold again when the first qualification timer times out or after the first qualification timer has timed out but before the second qualification timer times out, and starting the second qualification timer when a second transition of the digital data samples across the second hysteresis threshold is detected, and validating the second transition as a trailing edge of the pulse of the digital data samples if the input signal remains below the second hysteresis threshold until the second qualification timer times out.

The current buffer may be stopped from storing further digital data samples after a time delay after the pulse trailing edge is detected in the data samples being stored in the current buffer. The method may further comprise storing information relating a particular extracted pulse.

In one embodiment consistent with the invention, the data may be stored in the at least two memory buffers in a time-multiplexed manner.

The information stored in the register relating to a particular pulse may include at least timing information and memory address information and/or a pulse number, the pulse numbers being incremented each time a new pulse is extracted.

The method may further comprise receiving control information for controlling the memory buffers to store only predetermined pulses according to their pulse number.

Thus, FIG. 1 shows an apparatus 1 for extracting individual pulses from an input signal containing a sequence, though not necessarily at regular intervals, of pulses provided at an input 3. The input signal is provided to an Analog to Digital Converter (ADC) 2 where it is converted into digital samples. The digital samples are provided at one output of the ADC 2 from where they are presented to an external memory 4 for storage and a second output of the ADC 2 from where they are supplied to a pulse extraction circuit 5.

The pulse extraction circuit 5 includes a trigger circuit 6 that provides triggers whenever the (digitised) input signal crosses one or more trigger levels in order to detect the leading and trailing edges of pulses in the input signal. The pulse extraction circuit 5 thus provides a positive trigger signal and a negative trigger signal indicative of the leading and trailing edges of an extracted pulse. The pulse extraction circuit 5 can be one such as described in UK Patent Application Number GB0427344.7 filed in the name of Agilent Technologies, Inc. The circuit described in this application comprises a controller, first and second hysteresis threshold comparators each having a first input for receiving the (digitised) input signal, a second input for receiving a hysteresis threshold value and an output coupled to the controller, wherein the first and second hysteresis threshold comparators compare the input signal with first and second hysteresis threshold levels, respectively, first and second qualification timers, each being controlled by the controller and having a time out output coupled to the controller, wherein the controller receives the outputs of the comparators and the timers and controls starting of the timers to enable the controller to determine whether a transition of the input signal across a hysteresis threshold level constitutes a leading pulse edge of the input signal or not.

Figure 2:
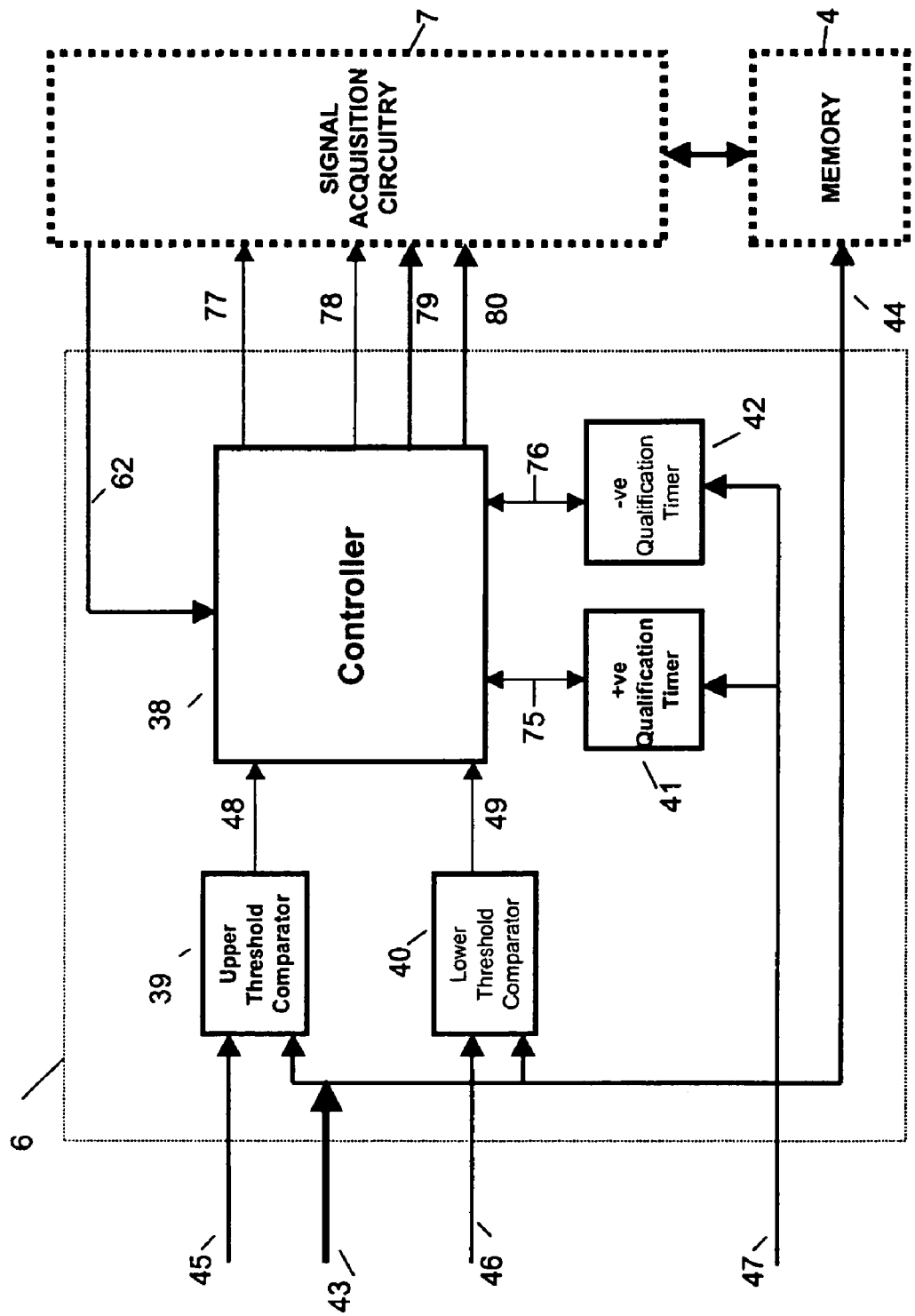
FIG. 2 shows a schematic block diagram of a pulse extraction circuit that can be used in the circuit of FIG. 1, consistent with certain embodiments of the present invention.

Accordingly, as shown in FIG. 2, one embodiment of the pulse extraction circuit 5 includes a trigger circuit 6 which comprises a controller 38, upper hysteresis threshold and lower hysteresis threshold comparators 39 and 40, a positive qualification counter 41 and a negative qualification counter 42.

A first input 43 to the trigger circuit 6 provides an input signal from an ADC 2 in which the signal whose pulses are to be detected, for example an RF power signal, is digitised. This input 43 is passed to first inputs of the first and second comparators 39 and 40 and to a direct output 44 of the trigger circuit 6 to the memory 4. The trigger circuit 6 has two further inputs 45 and 46 providing predetermined upper and lower hysteresis threshold levels for the two comparators 39 and 40, respectively. A final input 47 to the trigger circuit 6 provides a predetermined qualification time value to the positive and negative qualification timers 41 and 42. Outputs 48 and 49 of the comparators 39 and 40 are coupled to the controller 38, which is also coupled, via links 75 and 76, to the qualification timers 41 and 42, to receive their outputs, as well as controlling the operation of the qualification timers.

The controller 38 is used to detect rising and falling edges of pulses in the digitised signal from input 43, as will be explained more fully below. When the controller 38 detects a rising or falling edge, outputs 77 and 78 are passed to pulse capture circuit 7. The pulse capture circuit 7 controls the storage of the digitised signal samples in the memory 4 and passes the address in the memory 4 where the digitised data is to be stored to the memory 4. Outputs 77 and 78 of the controller 38 provide positive and negative validation triggers, respectively, to the pulse capture circuit 7 providing an indication that particular transitions that have been stored in the memory 4 have been validated as edges. The addresses in the memory 4 of such transitions that have been validated as leading and trailing edges are passed to the pulse capture circuit 7 on outputs 79 and 80, respectively.

Figure 3:
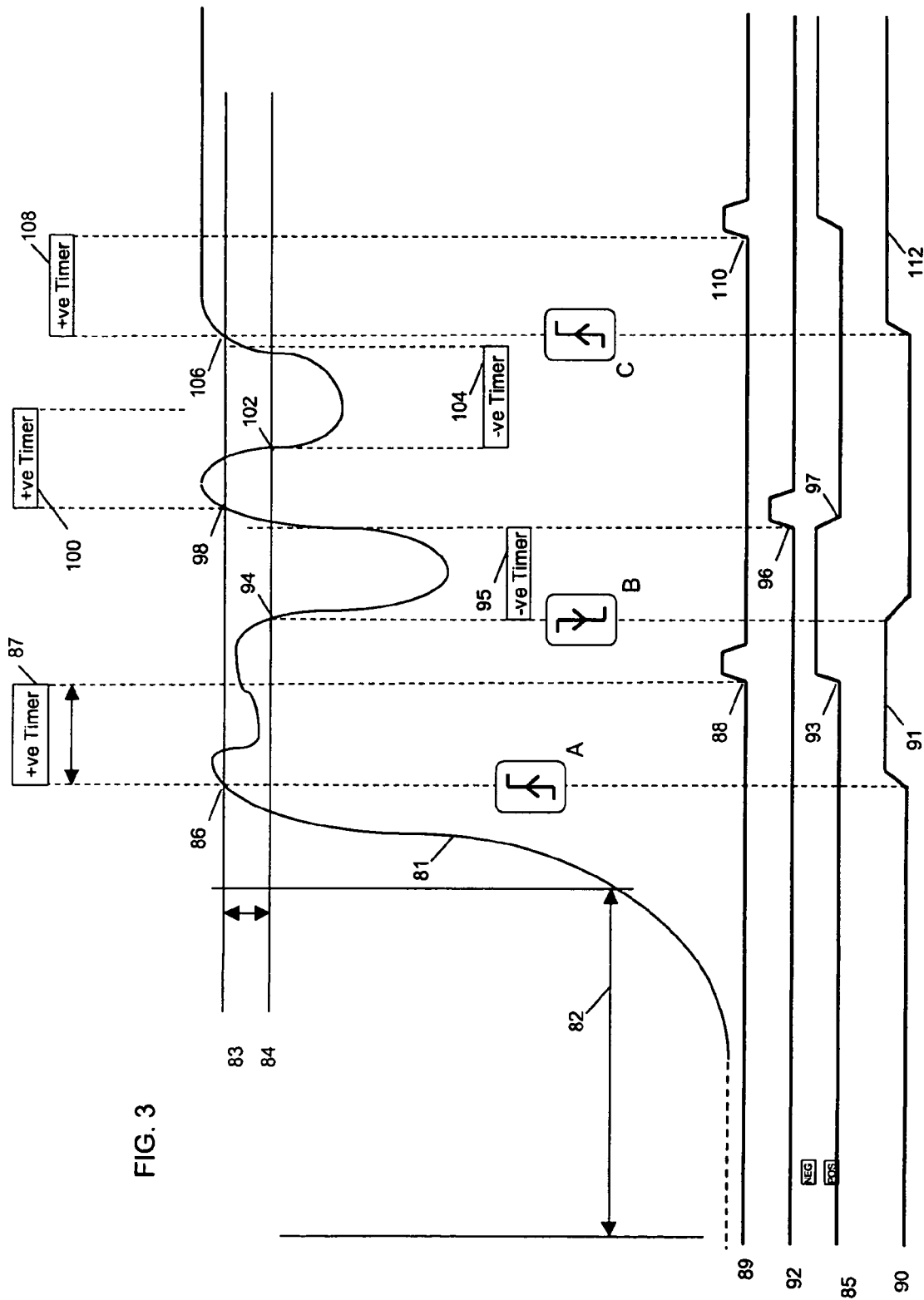
FIG. 3 shows an example of a waveform indicating the trigger detection signals generated by the pulse extraction circuit of FIG. 2, consistent with certain embodiments of the present invention.

Operation of the trigger circuit 6 will now be more fully explained with reference to FIG. 3, which shows a relatively simple waveform. Firstly, the status of the signal 81 is determined. This is shown within the period indicated by arrow 82, where the signal level stays below the level of the upper (and lower) hysteresis thresholds, indicated by lines 83 and 84, respectively, for a period greater than a qualification time, which may be provided by one of the two qualification timers. In any event, the signal state is determined as being "low", as indicated by digital signal 85, which is in a low state, indicating that the next edge to be detected is a rising edge.

Thus, the first rising transition that is detected by the comparator 39, occurs at point 86, where the signal 81 crosses over the upper hysteresis threshold 83. This causes the positive qualification timer 41 to be started, which then times a positive qualification period 87. Furthermore, the detection of the rising transition at point 86 also causes the address in the memory 4, where this part of the signal is stored, to be latched by the controller 38, in case this rising transition should later be validated as being a rising edge. A determination is made that the signal remains above the lower hysteresis threshold 84, until the positive qualification timer times out, so that a positive validation trigger 88 is generated, as shown in digital signal 89. When this positive validation trigger is generated, the controller 38 validates the rising transition at point 86 as being a rising edge (indicated at A) and this is shown schematically as digital signal 90 indicated by the beginning of the pulse 91. It will, of course be appreciated that digital signal 90 cannot be generated in real time in parallel with the digital signals 85, 89 and 92, since, at the time the rising transition is first detected, it is not yet known whether it constitutes a rising edge or not.

When the positive validation trigger 88 is generated, this also causes the level of digital signal 85 to switch (as shown at point 93) to indicate that the input signal is in a "high" state, so that the next edge to be detected will be a falling edge. Moving on to the next falling transition, indicated at point 94, where the signal 81 crosses over the lower hysteresis threshold 84 is detected, this causes the negative qualification timer 42 to be started, which then times a negative qualification period 95. Furthermore, the detection of the falling transition at point 94 also causes the address in the memory 4, where this part of the signal is stored, to be latched by the controller 38, in case this falling transition should later be validated as being a falling edge. In this case, it can be seen that the signal remains below the lower hysteresis threshold 84, until the negative qualification timer times out, so that a negative validation trigger 96 is generated, as shown in digital signal 92. When this negative validation trigger is generated, the controller 38 validates the falling transition at point 94 as being a falling edge (indicated at B) and this is shown schematically in digital signal 90 as the end of pulse 91.

When the negative validation trigger 96 is generated, this also causes the level of digital signal 85 to switch (as shown at point 97) to indicate that the input signal is in a "low" state, so that the next edge to be detected will be a rising edge. The next rising transition, indicated at point 98, occurs where the signal 81 crosses over the upper hysteresis threshold 83. This causes the positive qualification timer 41 to be started, which then times a positive qualification period 100. Again, the detection of the rising transition at point 98 also causes the address in the memory 4, where this part of the signal is stored, to be latched by the controller 38. In this case, it can be seen that the signal 81 falls below the lower hysteresis threshold 84 (as shown at point 102) while the positive qualification period 100 is still running, causing the negative qualification timer 42 to start timing a negative qualification period 104. However, after the positive qualification period 100 ends, and the negative qualification period 104 also ends, without the signal 81 having crossed over the upper hysteresis threshold 83, the rising transition at point 98 is considered not to be a rising edge and therefore the next rising transition is looked for, which is found at point 106, where the signal 81 crosses over the upper hysteresis threshold 83. Again, the positive qualification timer 42 is started, which then times a positive qualification period 108 and the detection of the rising transition at point 106 also causes the address in the memory 4, where this part of the signal is stored, to be latched by the controller 38. In this case, it can be seen that the signal 81 remains above the lower hysteresis threshold 84 for the positive qualification period 108, so that a positive validation trigger 110 is generated, causing the rising transition at point 106 to be validated as a rising edge (indicated at C) of pulse 112.

It can be seen, therefore, that the controller starts the first qualification timer when a first transition of the input signal across the first hysteresis threshold level is detected, starts the second qualification timer when a transition of the input signal across the second hysteresis threshold level is detected whilst the first qualification timer is timing, and wherein the controller validates the first transition as a leading edge of a pulse of the input signal if the input signal is above the first hysteresis threshold level again when the first qualification timer times out or before the second qualification timer times out.

The transition may be a rising transition and the controller may control the first qualification timer to start timing when a rising transition is detected by the first hysteresis threshold comparator, and wherein the rising transition is validated as a leading rising pulse edge of the input signal if the input signal remains above a lower hysteresis threshold level until the first qualification timer times out.

The transition may be a rising transition and the controller may control the first qualification timer to start timing when a rising transition is detected by the first hysteresis threshold comparator, and wherein the rising transition is validated as a leading rising pulse edge of the input signal if the input signal is above a lower hysteresis threshold level when the first qualification timer times out.

The transition may be a rising transition and the controller may control the first qualification timer to start timing when a rising transition is detected by the first hysteresis threshold comparator and may control the second qualification timer to start timing when a falling transition is detected by the second hysteresis threshold comparator whilst the first qualification timer is still timing, and wherein the rising transition is validated as a leading rising pulse edge of the input signal if the input signal crosses back above an upper hysteresis threshold level while the second qualification timer is still timing after the first qualification timer has timed out.

The controller may control the second qualification timer to restart timing each time a falling transition is detected by the second hysteresis threshold comparator whilst the first qualification timer is still timing. The period timed by the first qualification timer may be the same as the period timed by the second qualification timer. Each qualification timer may time a period that is equal in length to a minimum pulse width.

Thus, the pulse extraction circuit 5 can differentiate between a single modulated pulse, a pair of noise spikes, or two separate pulses within the input signal, such that the detection of an edge occurs a finite time after the edge occurs and, in the case of heavily modulated pulses, the time between the edge and the detection point may be variable.

The positive and negative trigger signals from the pulse extraction circuit 5 are passed to pulse capture circuit 7 which includes a trigger selection gate 8 which passes one of the signals to a pulse capture state machine 10. The pulse capture state machine 10 provides a RAM Write enable signal to the external memory 4 to enable the digital samples from the ADC 2 to be stored at given addresses in a given memory buffer 14 of the external memory 4. The given memory buffer 14 and the given addresses are controlled by the pulse capture state machine 10, with the trigger signals from the pulse extraction circuit 5 being used by the pulse capture state machine 10 to disable the RAM Write enable signal and thereby prevent the data being overwritten once a pulse is detected.

As can be seen schematically in FIG. 1, the pulse capture state machine 10 controls buffer pointers 11 in a plurality of sets 12 of registers 13 which indicate which of a plurality of memory buffers 14 in the external memory 4 are being utilised at a particular time as Current and Next memory buffers. A Random Access Memory (RAM) in the pulse capture state machine 10 provides as many sets 12 of registers 13, as there are memory buffers 14 in the external memory 4. Each set 12 is formed of a number of registers 13, for example eight. Each set 12 of registers 13 can store information relating to a particular pulse that may be stored in a particular one of the memory buffers 14 of the external memory 4. As mentioned above, one of the memory buffers 14 is used as a Current buffer and one of the buffers 14 is used as a Next buffer at any particular time. The memory addresses corresponding to these buffers 14 are stored in the corresponding set 12 of registers and are provided to the external memory 4 to enable the appropriate digital samples to be stored at those addresses in the external memory 4. Thus, each register set 12 will store the start (base) address for the data stored in the corresponding memory buffer, the size of the buffer, the end address, the addresses of the positive and negative triggers, as well as other information, such as a number given to the particular pulse.

The pulse capture circuit 7 is controlled by an acquisition state machine 9 in order to start the capture of a pulse when required. For example if only particular chosen pulses are needed to be captured, then the acquisition state machine 9 will control the capture state circuit accordingly. Reading of the memory buffers 14 and the corresponding register set 12 is also controlled by the acquisition state machine 9. Waveform processing Digital Signal Processing (DSP) circuitry 15 reads the data from the memory buffers 14 of the external memory 4 and the register sets 12 and carries out the required pulse measurement analysis, the result of which is then provided at an output 16.

The memory addresses provided by the buffer pointers 11 in conjunction with pulse capture state machine 10 to the register sets 12 are used by digital circuitry in the pulse capture circuit 7 to provide time multiplexed addresses to the external memory 4 so that the digital samples are stored in both the Current memory buffer and the Next memory buffer.

Each buffer within the external memory 4 is described using one of the register sets 12. The base address and size registers are used to locate the particular buffer 14 within memory 4. Data will be written consecutively between base address and base address+size before looping back to base address. Each set 12 should have its base address and size programmed to provide non-overlapping buffers. When the capture State Machine 10 is started, the base address and size values for the current buffer are read from the register array 13 and loaded via multiplexers 18 & 19 into a current start address register 22 and current size register 21, respectively. An offset is then generated using a counter comprising a multiplexer 23, adder 24 and register 25. This counter starts with a value of zero. As ADC samples arrive, they are doubled up and each set of two samples is written into the current memory buffer 14 every second cycle. The address into which the data is written is formed by adding the current start address from register 22 to the current offset from register 25 using an adder 26 and register 27. This address is passed through a phase multiplexer 28 every second cycle. The current offset will continue to increment until it is the same value as the size of the buffer. At this point it will be reset such that the next arriving data pairs will overwrite the previous data captured into the buffer at current start address+0,1,2,3 and so on. The current offset counter (23-25) is reset when a comparator 29 detects that the current size and offset are equal.

In this embodiment of the invention the next buffer is time multiplexed with the current buffer. The current buffer address generation circuitry described above updates on every second clock cycle. On the alternate clock cycles the next buffer addresses are generated using a similar circuit of register 30, adder 32, register 33, adder 34, register 35 and comparator 36. On the cycles immediately following those in which the current base address and size are read into registers 21 and 22, the next base address and next size are read from the correct register set 12 and latched into the next start address register 30 and next size address register 31. The next offset is generated using the counter made up of adder 32 and register 33 which is, in turn, added to the next start address by adder 34 to produce the next address 35. This address is fed to the external memory 4 via the phase multiplexer 28 which selects between the current and next addresses every clock cycle. Thus every ADC data pair is written into both the current and next buffers.

The circuit is capable of capturing a sequence of pulses. At the point where a pulse has been captured, no further data is written to the current buffer. The next buffer becomes the current buffer and the register set 12 is accessed to provide a new set of values to point to a new next buffer. The most important thing is to ensure that the data being written into the next buffer before the changeover is continuous over the transition where the next buffer becomes the current buffer.

When the last data pair is written to the last location within the current buffer, the offset of that location is written back to the register set 12 as the end offset address so that the last and first locations within the buffer can be found. At the same point in time multiplexers 18 and 19 route the next start address from register 30 and size from register 31 into the current start address register 22 and current size register 21. The next offset is passed through multiplexer 23 into adder 24 to produce a current offset in register 25 one greater than the last value in the next offset register 33. This process has to occur within a single cycle as the next address which was being output on the "next" phase is now having to be output on the "current" phase a single cycle later. The structure of the counter 23-25 is what enables the orderly transition of addresses from the next to current "time slot". One caveat is that should the next offset be equal to the next size at the point of changeover, then the reset from comparator 36 will in fact reset the current offset register 25 to allow the next buffer to write to the next buffer address which would be the first location within the buffer (offset 0), but this is not shown.

Figure 4:
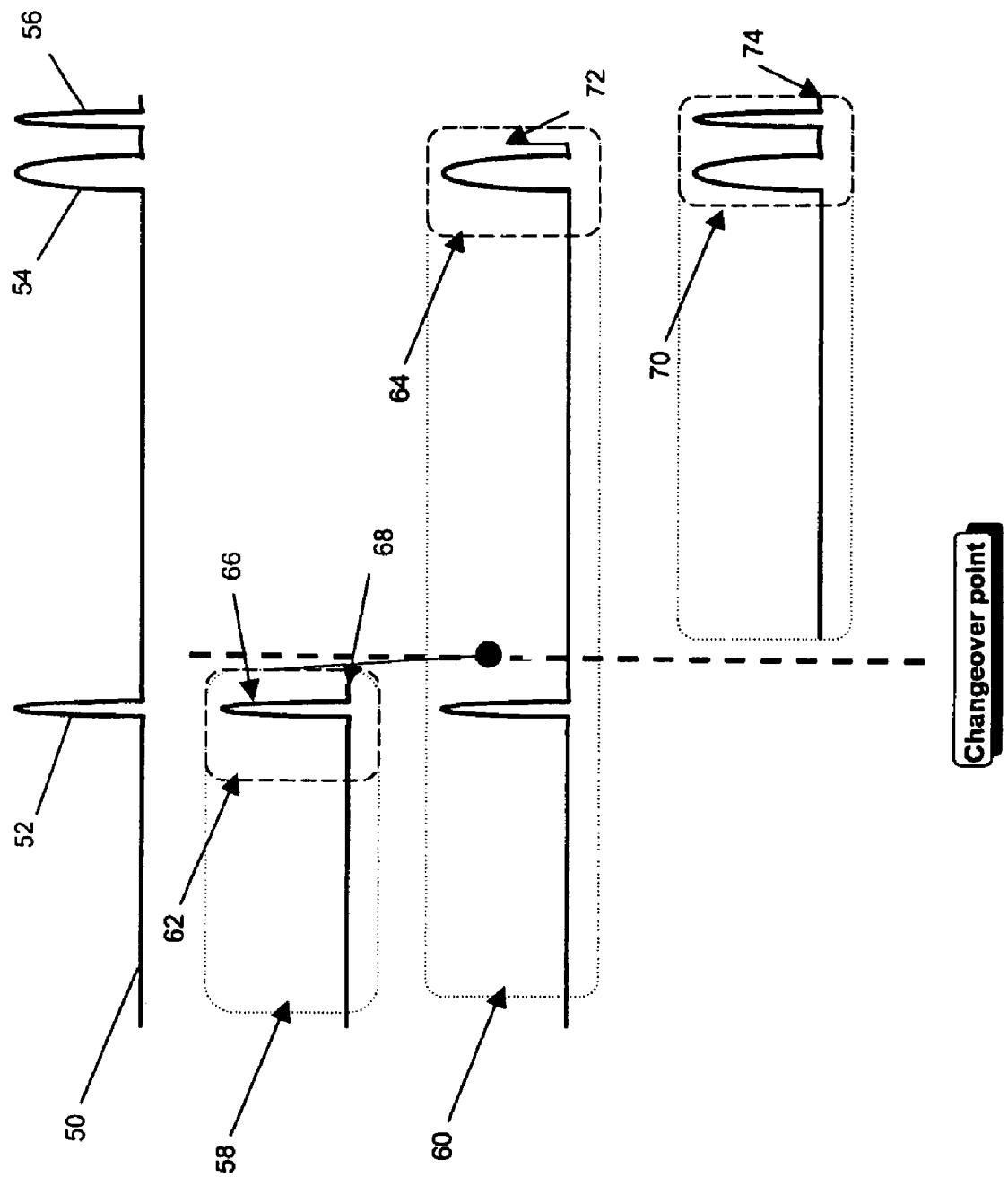
FIG. 4 shows a schematic diagram showing buffers from the circuit of FIG. 1, consistent with certain embodiments of the present invention.

Storing the digital samples in two buffers, the Current buffer and the Next buffer, ensures that no data is lost. As shown schematically in FIG. 4, the input waveform 50 consists of a first single pulse 52 followed, after some time, by a pair of pulses 54, 56 close together. At the start of capture, a first buffer 62 is the Current buffer 58 and a second buffer 64 becomes the Next buffer 60. Both buffers are the same size, capturing an amount of data as shown by the boxes defined by long dashed lines. So long as no pulses are present, both buffers fill up and data continues to be written into the buffers by overwriting the previously stored data until a pulse is detected. The pulse extraction circuit 5 detects the leading edge of the pulse at a front edge detection point 66 and the trailing edge of the pulse at a back edge detection point 68.

At the time the first pulse 52 is detected by the pulse extraction circuit 16, the first buffer contains the portion of the waveform as shown in the first buffer 62. The second buffer 64 will also capture the same pulse but this is overwritten as time progresses. When the trailing edge of the first pulse is detected (at the back edge detection point 68, the second buffer 64 becomes the current buffer and a third buffer 70 becomes the Next buffer. When the trailing edge of the next pulse 54 is detected at back edge detection point 72, the second buffer 64 stops capturing and is left containing the waveform shown. This includes a small portion of the following pulse 56 since the time taken to delineate this waveform as a single pulse overlaps the start of the next pulse. The third buffer 70 continues to capture the data. Now, the leading edge of pulse 56 is not missed because it is captured in the Next buffer (in this case the third buffer 70) until the back edge detection point 74 of the pulse 56 is reached. At this time, the third buffer 70, which became the Current buffer when the back edge detection point 72 was reached, stops capture and, as can be seen includes both pulses 54 and 56. However, the register corresponding to this third buffer will provide the address information indicating the memory addresses where the pulse of relevance is stored. Thus, it can be seen that each buffer contains a pulse, as well as the data leading up to the pulse and, depending on the time delay between the back edge detection point and the end of capture, data following the pulse, allowing rise and fall time measurements to occur on each buffer independently.

Since the circuit is capable of capturing individual pulses into individual memory buffers, it is no longer necessary to use time as the sole means of locating a pulse. Instead of time, pulses can be delineated by number. Thus, for example, the pulse stored in the first buffer is called Pulse #1, that in the second memory buffer is pulse #2, and so on. This means that particular pulses can now be easily chosen for capture and processing, and those pulses that are not required can be discarded. Conventionally, gates had to be set up relative to a trigger point to filter the pulses that were required. In most cases, gates are actually needed to be placed relative to the edge of the pulse. This can now be easily achieved and gates can be placed not only relative to the front of a pulse but also relative to the back or even the middle of the pulse. In the past the gate was provided a fixed distance from a trigger point and had fixed width. It is now possible to place gates based on the width of a pulse, e.g. place a gate over the middle 60% of a pulse. Thus variable width pulses can all have meaningful power measurements made in a single pass.

A small change to the pulse capture state machine 10 allows pulses to be missed out. As each pulse is detected, a counter is decremented and only the pulse co-incident with a count of zero is captured. Thus, a sequence of 600 pulses could have every 10th pulse captured and measured still within a 64 pulse limit. The incorporation of these multiple pulse capturing and gating improvements into a power meter would allow the user to perform a large number of useful measurements in a few seconds at most. Currently, using existing power meter measurement capability this task could take several hours.

Of course, in order to be able to select pulses only by pulse number, it is necessary to determine which pulse in a stream of pulses is the first. The trigger circuit 6 sends out a positive trigger signal every time a positive pulse is detected and a negative trigger signal every time a negative pulse is detected. Associated with the pulse is a location indicator that tells the acquisition state machine 9 exactly where the triggers occurred. The separate acquisition state machine 9 controls the capture of data based on the indications from the trigger circuit 6 by "holding-off" the acquisition. When a positive trigger pulse is passed to the acquisition state machine 9, a hold-off timer is started within the acquisition state machine 9. The trigger circuit 6 continues to generate triggers without knowledge of the hold-off timer. Each time the trigger circuit 6 detects a pulse whilst the hold-off timer is off, a new hold-off period is started. Obviously, triggers that occur during a hold-off period have no effect on the hold-off timer.

The acquisition state machine 9 only reacts to the hold-off timer when an acquisition is started. Should an acquisition be started during the hold-off period, then the acquisition state machine 9 will ignore triggers until the hold-off timer finishes. Once the acquisition state machine 9 has started the capture of data, hold-off periods generated by subsequent positive trigger pulses are ignored.

This permits an enhancement of the multi-pulse circuit to capture several bursts of pulses. For example, if a test signal consists of bursts of ten pulses within 1 ms, each burst is spaced apart by 10 ms. The hold-off period is set to 2 ms. Should the acquisition state machine 9 be started between the bursts then it will start as normal at the first pulse of the burst. It will capture the ten pulses into ten buffers but can continue to capture subsequent pulses into subsequent buffers. This is despite the fact that the 11th, 21st, etc. pulses will start new hold-off periods. The user can then examine several bursts at once and measure accurately the distance between bursts in a single pass.

Should the acquisition state machine 9 be started during a burst, the hold-off timer will be seen and acquisition will be held-off until it times out. The first pulse acquired will be the first of the next burst. Because the hold-off timer is running continuously from the positive trigger pulses, the issue of the very first trigger occurring anywhere is avoided. Although each acquisition could be asked to start in the middle of a burst, the hold-off timer has already aligned to the bursts by virtue of the fact that it has been running since the trigger circuit 6 was started.

In one embodiment of the invention the circuit is implemented in a Field Programmable Gate Array (FPGA) that provides 512×36 bit blocks of dual-port Random Access Memory (RAM). This memory has been taken advantage of in order to provide 64 sets 12, each of eight control/status registers 13, as mentioned above. Each register set 12 fully controls one of 64 memory buffers 14 in the main external Zero Bus Turnaround (ZBT) memory 4. A single circuit can be implemented that performs all the necessary operations to provide the capture of one pulse (and the simultaneous capture of the signal leading up to the next pulse). By the simple expedient of providing a register that points to the upper address bits of the Dual-port RAM, all the sets of control/status can be selected by changing this register.

As mentioned above, each register set 12 contains eight control/status registers 13. Two registers store base address and buffer size information, respectively. As a pulse acquisition takes place, other registers are updated. The memory addresses of the triggering positive edge and/or negative edges are stored in two of the registers of the set. Also stored is a 32 bit timestamp that locates the back edge of the pulse. As a pulse capture progresses, the minimum and maximum values of the incoming signal are worked out and are stored into a peak values register when a capture is completed. Also stored at the end of a capture is the end offset of the last word stored. The combination of the start buffer, buffer size and end offset data registers are used to find the start and end of the actual storage within a buffer. The start and size registers are programmed pre-acquisition to set up the location and size of each buffer.

Other control bits within the eight registers are used to control the order and number of buffers used. A stop bit in the register storing the base address can be used, for example so that if it is not set, then the state machine will continue on to the next buffer. If it is set, then the acquisition has captured its last pulse, and the circuit moves into the phase of reading the results from the ZBT memory 4 into the waveform processing circuitry 15. Waveform processing circuitry 15 can be circuitry contained within the same chip or be provided in an external DSP chip.

Another bit in the base address register causes the acquisition to jump back to buffer number zero on completion of the current pulse capture instead of moving on to the next numbered buffer. Thus, by programming a couple of bits in each set of buffers, they can be chained together to capture any number of pulses. This soft control allows capture to occur into a subset of buffers whilst retaining the data in others.

The register sets 12 that set up and record the operation of each memory buffer 14 occupy consecutive areas of the memory based register array. In order to access a particular set, the top address bits are changed. The "Next buffer" set is normally the set after the "Current buffer" set. In order to set-up the Current and Next buffer counters and working registers, the upper address bits are alternated between the Current and Next buffer sets, reading pertinent data on alternating cycles.

The address into which trigger data is written is latched. When the trigger qualifies (indicated by a pulse on trig_pos or trig_neg) the trigger address is written to the correct location within the 8-register set. This may be immediately followed by a write of the timestamp to the timestamp register if this is deemed to be the last trigger of a set. A trig_pos pulse can arrive on either phase of the two-phase pipe-line. If it arrives on the early one, it is stretched by one cycle so that the trigger address is always written on the current phase of the current/next alternation.

At start-up, each buffer's base address and size is read from its register set. The actual external memory addresses are worked out by adding a pointer offset to the base address. This pointer is incremented after every external write. When the pointer equals the size, it is reset back to zero. Thus the pointer circularly addresses all the locations in the pre-programmed buffer. The upper register set addresses are alternated where required and once the base address and sizes are loaded into working registers, the pre-fill commences. The Actual ZBT address shows the combination of the current and next addresses to memory.

The external ZBT memory 4 is one large contiguous memory area. It can be carved up into any number of buffers of any size (subject to the total memory size limit). Before starting an acquisition the acquisition state machine 9 works out how many buffers are required (from 1 to 64) and how big they need to be. It then programs the base address and buffer size registers within each 8-register set 12 to delineate the memory 4 into buffers 14. Once the memory 4 has been set up, the buffers 14 are chained together as necessary using above-mentioned "stop" and "back to zero" bits. The trigger circuit 6 (which is separate from the acquisition) is programmed with such things as trigger levels, hysteresis, max pulse width etc. Finally the number of the buffer to be used first is programmed and the acquisition can commence.

The acquisition state machine 9 and pulse capture state machine 10 then take over and the circuit automatically captures pulses and passes them to waveform circuitry 15. Both state machines are implemented in a manner well known to persons skilled in the art and the details of the implementation will not be further described here. The acquisition state machine 9 allows the process to be left running continuously, i.e. when a capture cycle is complete, another is started automatically and this process will continue until the processor intervenes to stop capture.

Operation of the pulse capture state machine 10 will now be more fully described with reference to FIG. 5. In this Figure, states are indicated by circles, flows between states by arrows and the cause of a state change is shown in a rectangle between states. The equations within the rectangles use the shorthand:

!=NOT;
.=AND;
+=OR.

Thus for example (!holdoff+(sel_trig. !too_big)) means "(NOT holdoff) OR (selected trigger AND not too_big)"

Figure 5:
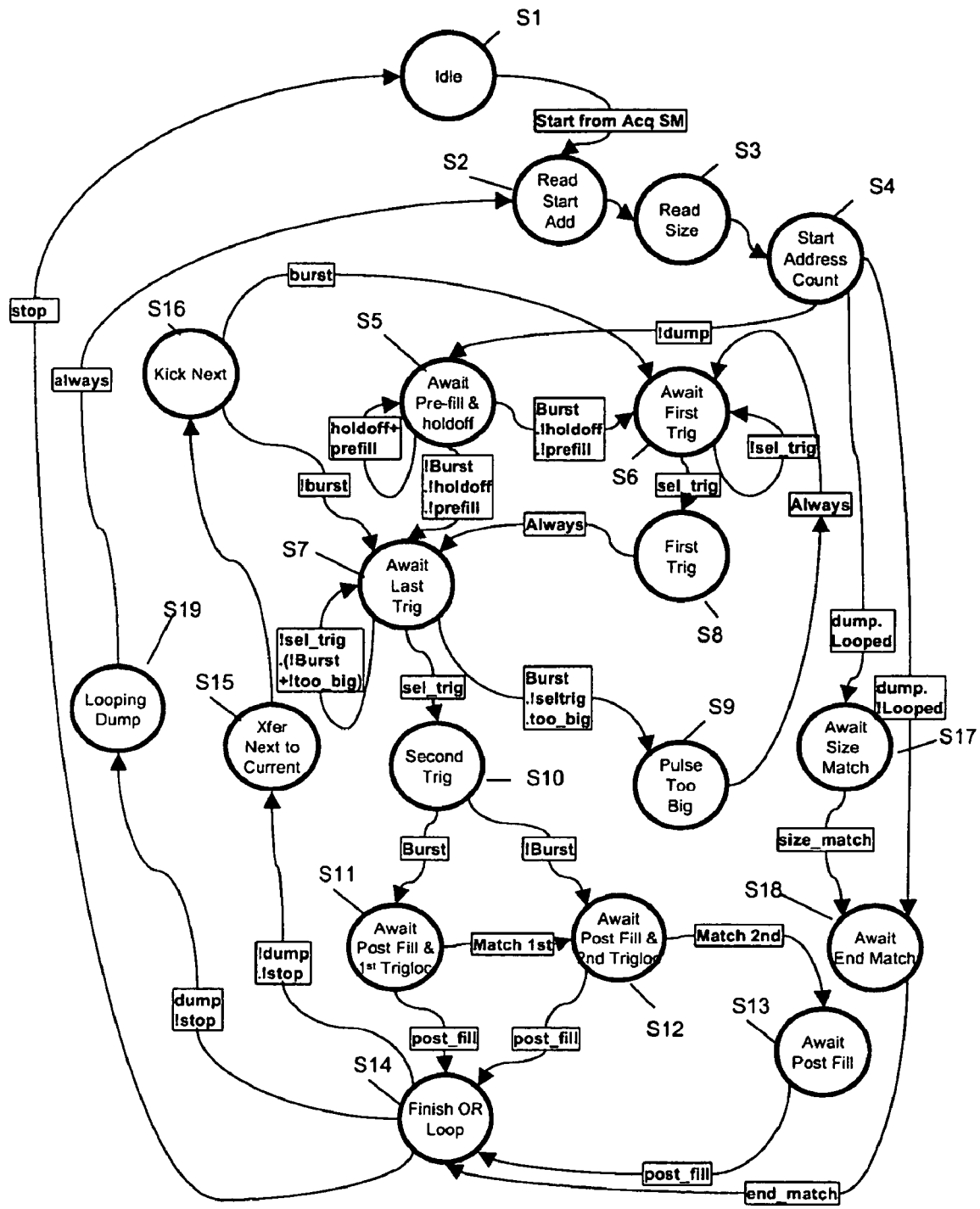
FIG. 5 shows a state diagram for a pulse capture state machine used in the circuit of FIG. 1, consistent with certain embodiments of the present invention.

Turning to FIG. 5, therefore, the pulse capture state machine 10 waits in the IDLE state S1 until acquisition is started. When started, the state machine moves to READ_START_AD state S2, then READ_SIZE state S3 and copies the memory based start address and size into working registers. In the next state S4 START_ADDRESS_COUNT starts an internal address counter at the START_ADDRESS.

The DUMP/not DUMP choice refers to DUMPing data from the buffer(s). The circuitry that performs captures is partially re-used to dump the captured data to the waveform processing circuitry 15. To minimise driving logic (and speed up the circuit) the dumping control has been "bolted onto the side of" the pulse capture state machine 10. However, ignoring dumping for now along the not/DUMP path, the AWAIT_PREFILL_AND_HOLDOFF state S5 is reached. In this state, the memory 4 is written at addresses pointed to by the internal address counter.

The pulse capture state machine 10 can be used in "normal" single-edge captures as well as single pulse captures and multiple pulse captures. In normal mode, a pulse or edge is shown on a display so that the user can make measurements on the displayed waveform. In order that the pulse or edge is well-centered on the screen, it is necessary to pre-fill the memory 4 before allowing a trigger pulse to trigger the acquisition. If this were not done, then the trigger pulse (which it should be remembered can occur quite some time after the trigger edge) could occur aligned with the very first sample. A triggered capture would then capture some more waveform before passing the data (via waveform processing circuitry) to the display. Unfortunately, in some instances, the actual trigger edge may not be captured if it occurred some samples before the first one written to RAM. To overcome this, a programmed pre-fill value is used that causes the acquisition circuit to ignore incoming trigger indications until the memory 4 has been pre-filled with sufficient samples such that when a trigger next occurs, it is guaranteed to have been captured within the pre-fill memory locations. Should a valid trigger be indicated during pre-fill, it will be ignored and the next trigger used instead.

The hold-off mechanism has already been described. Any trigger pulses that are detected when hold-off is not set will cause the hold-off counter to start. Subsequent trigger pulses during the counting of this hold-off counter are ignored. The acquisition will not get past AWAIT_PREFILL_AND_HOLDOFF until the hold-off counter counts out. Thus, the first pulse of an isolated pulse train can be delineated as described earlier.

The AWAIT_PREFILL_AND_HOLDOFF state S5 waits for the pre-fill and hold-off counters to count out before moving to a state that waits for a trigger. In pulse trigger mode, two edges will be acted upon, here termed the first and last. In edge trigger mode only one edge is acted upon so the state machine will skip processing the first edge and move directly to the last. Pulse triggering is programmed using a "burst" control bit. If set, a pulse is to be found so the state machine moves to AWAIT_FIRST_TRIG state S6. If "burst" is not set then a single edge trigger is to be looked for and the state machine moves to AWAIT_LAST_TRIG state S7.

In AWAIT_FIRST_TRIG state S6 the state machine 10 continues to fill memory 4 whilst looking for the selected trigger (sel_trig) to occur. The trigger circuit 6 outputs separate pulses for positive and negative trigger events. Sel_trig works out which polarity of trigger will cause the first trigger based on programmed trigger polarity and trigger type and passes the correct pulse to the state machine 10.

When the selected trigger signal occurs, the state machine 10 moves to FIRST_TRIG state S8. This state is required to give the circuitry enough time to write the trigger address into one of the set 12 of eight registers and switch all the trigger control circuitry over to look at the other edge. The state machine then moves to the AWAIT_LAST_TRIG state S7.

Irrespective of how the AWAIT_LAST_TRIG state S7 was reached, the circuit looks for the selected trigger and, when it occurs, moves into the post-trigger part of the state machine operation, where a sufficient amount of captures take place to show what happens after the trigger or, if required, capture a portion of the waveform that occurs a long time after the trigger point.

The one caveat is that should the circuit be looking for a pulse and the back edge of the pulse is not seen within the time taken to loop once round the memory buffer, then the state machine will discard the pulse as being too wide and loop back through the PULSE_TOO_BIG state S9, switch back the sel-trig to look for the first edge again and move to AWAIT_FIRST_TRIG state S6 to attempt to capture a pulse sufficiently narrow to fit in the buffer.

If the circuit were left to simply wait for the last edge of a too-wide pulse, then the lack of a front edge (due to it having been overwritten as the memory buffer loops around second time) would seriously confuse any downstream circuitry trying, for example, to make pulse-width measurements or measurements based upon knowing the location of the edges. Therefore, the user can set a maximum pulse width and throw away any pulses that are too wide. The user would be informed that this had happened and could adjust the maximum pulse width if required for subsequent captures.

Once the last trigger occurs, the state machine moves from AWAIT_LAST_TRIG state S7 to SECOND_TRIG state S10. In SECOND_TRIG state S10, the address location of the trigger is stored in the relevant register of the register set 12 and a timestamp is also written so that the distance between pulses/edges can be accurately worked out.

Depending upon whether two or one edges were captured, (using "burst"), the state machine then moves to a state that waits for a programmed "post-fill" number of further samples to be captured before finishing the capture. As mentioned earlier, the user may wish to use the trigger to capture an event that occurs long afterwards. For this reason, the address at which the trigger sample was captured is compared with the address_counter that forms the buffer memory write address. If sufficient samples are captured post-trigger that the buffer address loops back round and overwrites the data pertaining to the actual trigger point, then a single-bit flag is set that informs the post processing circuitry that the trigger point is no longer stored, and the display/measurements will be adjusted accordingly. In multi-pulse mode, the post-fill value will be programmed to be small (or zero) so that the current/next switchover does not occur so late that a subsequent pulse is not correctly captured.

The state machine, having entered one of the three AWAIT_POSTFILL states S11, S12, S13 invalidates trigger addresses if the post fill is sufficiently large that the trigger location is overwritten. This is done by comparing the trigger address stored in the register set 12 with the current offset using comparator 29 and multiplexer 37. When the post fill timer counts out it will then move to FINISH_OR_LOOP state S14.

In FINISH_OR_LOOP state S14, a number of things occur: the current memory address is transferred into the end_address register of the register set 12 and the minimum and maximum signal values since the last buffer switch are also stored. Thus, the waveform processing circuitry 15 can quickly gauge the signal size limits and also know from which location in memory the buffer starts and ends (the start address is usually the one after the end_offset).

If this is the last buffer to be written (the STOP bit is set) then the state machine moves back to the IDLE state S1 until told by higher entities to begin the process of reading back the data.

If it is not the last buffer to be filled, then the state machine moves to XFER_NEXT_TO_CURRENT state S15 which transfers control of the Next buffer (which has been quietly filling in the background) to become under control of the state machine as the Current buffer. The KICK_NEXT state S16 then gets the new Next buffer from the correct set of buffer registers and starts off the process of writing to it (in the background). The loop is then completed when the state moves to AWAIT_FIRST_TRIG state S6 or AWAIT_LAST_TRIG state S7 depending upon whether a single edge or pulse is being looked for. The process repeats until the last buffer is reached. On completion of the last buffer's data capture the state machine returns to the IDLE state S1 ready for dumping data to the post-processing circuitry.

Dumping data from the RAM based buffers to post processing circuitry uses the same address generation logic as was used to write the data to the buffers in the first place. When the acquisition state machine sends START with DUMPING set, the start address and size are read into the same current registers 21 and 22 as used for acquisition. If the total capture length was less than a buffer length then the data exists from offset zero to the offset stored in the end_offset register. If the total capture was longer than the buffer then the capture will have looped round and be stored from end_offset+1 to the end of the buffer and then from offset 0 to end_offset. The fact that a buffer was "looped" was stored as an indication bit along with the end offset in the same register. The dumping process will therefore require to start from offset zero or offset end_offset+1 depending upon the setting of the "looped" indication bit. In state S4 the end offset is read into the counter 23-25 through multiplexer 23 automatically incrementing as it does. The end offset is also compared with the current size register 21 using comparator 29 via multiplexer 37 (the end offset is being read from the register set 12 at this point). This permits the circuitry to detect the special case where the end offset points to the last location within the buffer requiring it to start from offset 0. It can be clearly seen that virtually no extra circuitry has been needed to catch this special case.

If, therefore, the buffer has been looped, the state machine will move from state S4 to state S17 where multiplexer 37 is set to compare the size against the current offset. When a match occurs, the current offset register 25 is reset and the state machine moves to state S18. In state S18 the end offset (being continuously read from the register set 12) is compared against the current offset using multiplexer 37 and comparator 29. When a match occurs, the state machine moves to state FINISH_OR_LOOP S14. The upshot of all this is that the data is addressed for reading from the memory 4 from the address after the end offset to the end of the buffer and then from the start of the buffer up to the end offset without resorting to extra circuitry. In the case where the buffer has not looped, the state machine moves from state S4 directly to state S18 and simply compares the offset against the end offset. This results in data being read from the start of the buffer (offset 0) to the end offset.

A number of buffers may be populated with data. When the state machine reaches state S14 the stop bit is checked and if not set, the state machine moves to state LOOPING_DUMP S19 where the buffer pointer is moved to the next buffer and the process repeats the dumping of the next buffer and so on until the last buffer is reached. The last buffer (indicated by having the STOP bit set) causes the state machine to move from state S14 to the IDLE state S1. At this point, all the data has been passed on to downstream waveform processing circuitry 15 and the acquisition circuitry could start a new capture at the same time as the downstream waveform processing circuitry 15 is processing the current set of waveforms.

An alternative approach to the above whereby the next and current address generating logic is simply switched back and forth between the next address circuitry and the current address circuitry may alternatively be used. Although it firstly appears easier to implement, this approach was examined and it was realised that all the circuitry required by the current address logic for end address matching, trigger address matching and tight coupling to the state machine would have to be replicated exactly in the next address circuitry (when it became the current address circuitry). By adopting the implementation described above, the next address circuitry becomes considerably simpler than the current address circuitry and has a lot less interconnect to "external" circuits. This circuit simplification and interconnect reduction allows the functionality to run faster as the critical timing paths are reduced in number and geographically smaller within the implementing device.

At the finish point where the next buffer becomes the current buffer, the current pointer offset is N and the next offset is X. The ZBT RAM ADDRESS writes the Old Current Base+N (OCBS+X) followed by the Old Next Base+X (ONBS+X). On entering the XFER_NEXT_TO_CURRENT state S15, the Current offset pointer register 25 is loaded with the next pointer value from register 33 (X) plus one. Ordinarily it is loaded with its own pointer value plus one, so the same "plus one" adder 24 can be used for both.

Thus the Current Offset now has the next offset value. The base address is also transferred across. On the cycle immediately following the ONBS+X write, the write line to the external RAM is rescinded for one cycle, preventing a write to the OCBS+N+1 address location. The stored end address of the current buffer is N not N+1. It would therefore not be a good idea to write an extra data value at this point.

The XFER state also causes the next base address to be overwritten with the "new" next base address which is duly written to, in the external memory (NNBS). The following cycle writes ONBS+X+1 which is the address immediately following the last one written to whilst the old "next buffer" was still the "next buffer" and not the "current" one. The incrementing pointers continue to provide external addresses for the two buffers and the incoming data continues to be written into the two buffers on alternating cycles.

It can be readily seen that the data being written to the "Next" buffer is continuous across the changeover despite having to jump phases from the next phase to the current phase.

The state machine diagram of FIG. 5 pertains mainly to the Current buffer. As mentioned earlier, sample data is written to two places in an alternating time-multiplexed fashion. As well as writing data in a time-multiplexed fashion, the state machine and attached address control circuitry is also time-multiplexed. This is not shown in the state machine diagram in order to make it easier to follow. The state machine only updates every two cycles. In some cases, advantage of this is taken to perform two control register writes and/or reads in one operation. Updates to the state machine only occur every second clock cycle. Events such as single-cycle-wide trigger pulses have to be widened where necessary (in the sel_trig) circuit so that the state machine responds to them even when they occur on the intervening cycle.

When decimation is turned on (e.g. capturing every 10th sample), the state machine is slowed down too, such that the relationship between memory writes and state-machine changes is maintained. This helps to keep the circuit uncluttered with specific decimation control circuitry.

Figure 6:
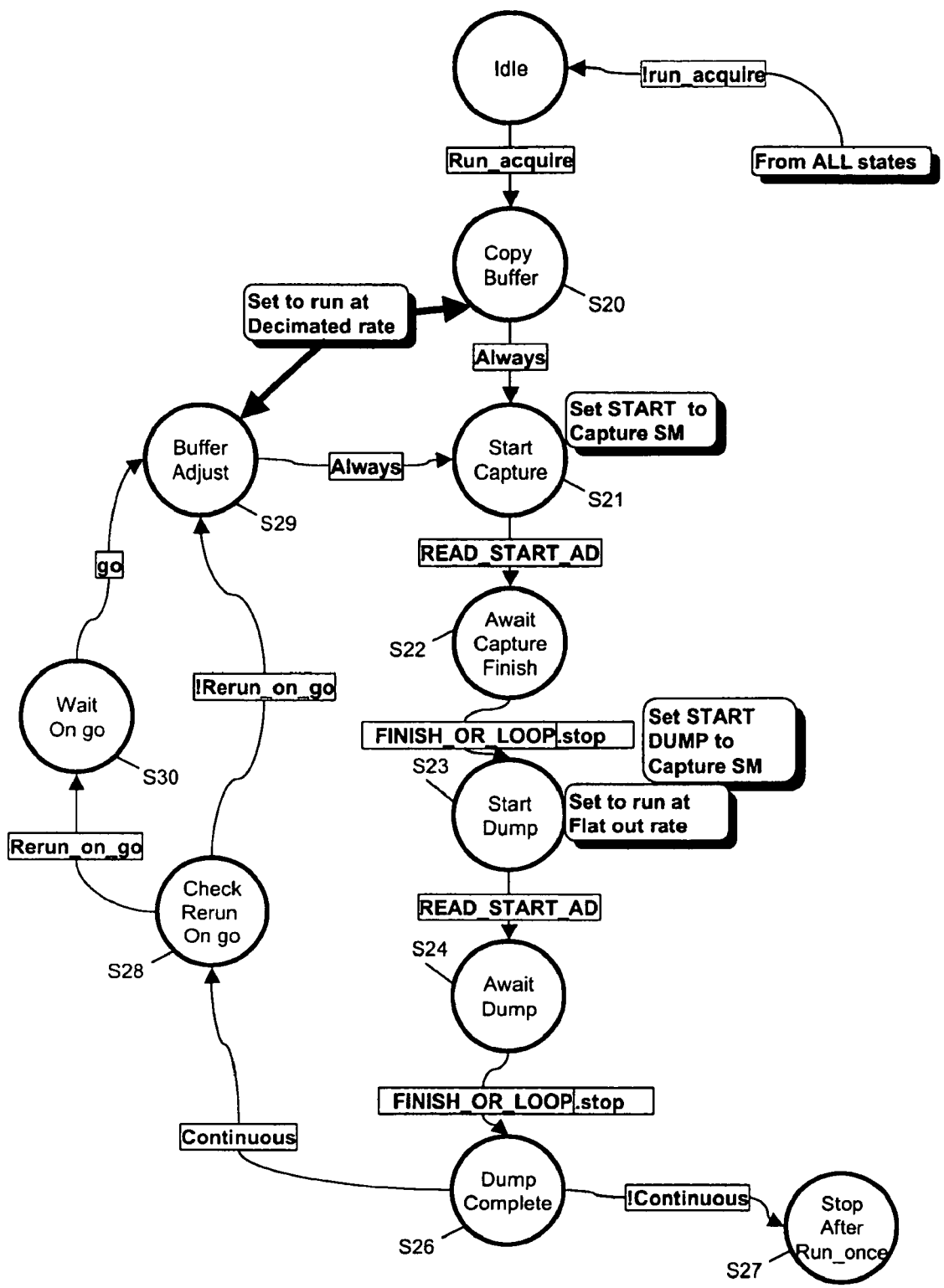
FIG. 6 shows a state diagram for a pulse acquisition state machine used in the circuit of FIG. 1.

FIG. 6 describes the operation of the acquisition state machine 9. The purpose of this state machine is to control the timing of acquisition, dumping and re-acquisition. The acquisition state machine 9 waits in the IDLE state S20 as long as it is not instructed to start the acquisition via the RUN-ACQUIRE control signal. When so instructed, the state machine moves to COPY_BUFFER state S21, where it works out which buffer is being used and copies it into a working register. It then moves on to START_CAPTURE state S22 and sends a START to the capture state machine. In the next state S23 AWAIT_CAPTURE_FINISH the acquisition state machine 9 waits for the capture state machine to finish the capture, and then moves to state S24 where it sends a START_DUMP command to the pulse capture state machine. Again the acquisition state machine 9 waits for the dump to complete in state S25 and, once the Dump is complete in state S26, it can then do one of a number of things. In run_once mode it stops acquiring and moves to STOP_AFTER_RUN_ONCE state S27. Alternatively, in CONTINUOUS mode it will move to state S28 to check whether another capture from the next buffer (or buffer set) in line can be performed. A capture can occur whilst the previous capture is being processed. The waveform processing takes a finite time, and the waveform processing circuitry may not have processed its dumped data yet, so the option exists of holding up the next capture at state S30 until the waveform processing circuitry sets a flag.

In either case the state machine gets to BUFFER_ADJUST state S29 where the next buffer is worked out and another capture is started. The process will keep looping until the main processor resets "continuous" where it will stop cleanly at the end of a capture. Capture can also be forcibly stopped by resetting the RUN_ACQUIRE control line (for situations where a lack of triggers prevents an orderly completion).

When capturing, the whole circuit can run at the decimated rate. If the decimation factor is large, (e.g. 1 capture every 1000 clock cycles) then the dumping would also take a long time as it uses the same circuitry. To speed things up, the acquisition state machine 9 will automatically switch from the decimated rate to flat out operation during dumping and switch back to the decimated rate for the next capture.

It will be appreciated that although only one embodiment of the invention has been described in detail, various modifications and improvements can be made by a person skilled in the art without departing from the scope of the invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

The invention claimed is:

1. Apparatus for extracting individual pulses from an input signal, the apparatus comprising:
   a. an input terminal operable to receive an input signal comprising a stream of pulses;
   b. an analog to digital converter (ADC) having an input coupled to the input terminal for receiving the input signal, the ADC operable to convert the received input signal into digital data samples, and provide the digital data samples at an output;
   c. memory comprising a plurality of logically separate memory buffers coupled to the output of the ADC operable to store the digital data samples;
   d. a pulse extraction circuit having an input coupled to the output of the ADC operable to detect leading and trailing pulse edges in the digital data samples and an output;
   e. a memory buffer controller coupled to the output of the ADC, the memory and the output of the pulse extraction circuit operable to control storage of the digital data samples in the memory, wherein the digital data samples are stored into at least two memory buffers such that the digital data samples are stored into at least a current buffer and a next buffer, and wherein, when a pulse trailing edge is detected in the data samples being stored in the current buffer, that current buffer is stopped from storing further digital data samples and the next buffer becomes the current buffer with a new buffer becoming the next buffer; and
   f. an output terminal operable to provide the digital data samples from the current buffer after the current buffer has stopped storing further digital samples.

2. Apparatus according to claim 1, further comprising waveform processing circuitry coupled to the output terminal that receives the digital data samples relating to a detected pulse from a memory buffer that has been stopped from storing further digital data samples, that memory buffer then becoming available to become a next buffer.

3. Apparatus according to claim 1, wherein said pulse extraction circuit comprises a controller, first and second hysteresis threshold comparators each having a first input operable to receive the digital data samples, a second input operable to receive first and second hysteresis threshold values and an output coupled to the controller, wherein the first and second hysteresis threshold comparators compare the digital data samples with first and second hysteresis threshold levels, respectively, first and second qualification timers, each being controlled by the controller and having a time out output coupled to the controller, wherein the controller receives the outputs of the comparators and the timers and controls starting of the timers to enable the controller to determine whether a transition of the digital data samples across a hysteresis threshold level constitutes a leading pulse edge, and whether a transition of the input signal across a hysteresis threshold level constitutes a trailing pulse edge of the input signal.

4. Apparatus according to claim 1, wherein the current buffer is stopped from storing further digital data samples after a time delay after the pulse trailing edge is detected in the data samples being stored in the current buffer.

5. Apparatus according to claim 1, wherein said memory buffer controller comprises a plurality of registers each for storing information relating to a particular extracted pulse.

6. Apparatus according to claim 5, wherein said information stored in the register relating to a particular pulse includes at least timing information and memory address information.

7. Apparatus according to claim 5, wherein said information stored in the register relating to a particular pulse includes at least a pulse number, the pulse numbers being incremented each time a new pulse is extracted.

8. Apparatus according to claim 7, wherein said memory buffer controller includes an input operable to receive control information for controlling the memory buffers to store only predetermined pulses according to their pulse number.

9. Apparatus according to claim 1, further comprising an acquisition circuit having an input coupled to the output of the pulse extraction circuit and an output coupled to the memory buffer controller, the acquisition circuit including a timer operable to enable the memory buffer controller a predetermined time after a pulse edge is detected.

10. Apparatus according to claim 1, wherein the data is stored in the at least two memory buffers in a time-multiplexed manner.

11. A method of extracting individual pulses from an input signal, the method comprising:
   a. receiving an input signal comprising a stream of pulses;
   b. converting the received input signal into digital data samples;
   c. detecting leading and trailing pulse edges in the digital data samples;
   d. storing the digital data samples into at least two memory buffers such that the digital data samples are stored into at least a current buffer and a next buffer, and wherein, when a pulse trailing edge is detected in the data samples being stored in the current buffer, that current buffer is stopped from storing further digital data samples and the next buffer becomes the current buffer with a new buffer becoming the next buffer; and
   e. outputting the digital data samples from the current buffer after it has stopped storing further digital samples.

12. A method according to claim 11, further comprising processing the digital data samples output from a memory buffer that has been stopped from storing further digital data samples, that memory buffer then becoming available to become a next buffer.

13. A method according to claim 11, wherein detecting leading and trailing pulse edges comprises:
   starting a first qualification timer when a first transition of the digital data samples across a first hysteresis threshold is detected;
   starting a second qualification timer when a transition of the digital data samples across a second hysteresis threshold is detected whilst the first qualification timer is timing; and
   validating the first transition as a leading edge of a pulse of the input signal if the digital data samples are above the first hysteresis threshold again when the first qualification timer times out or after the first qualification timer has timed out but before the second qualification timer times out; and
   starting the second qualification timer when a second transition of the digital data samples across the second hysteresis threshold is detected; and
   validating the second transition as a trailing edge of the pulse of the digital data samples if the input signal remains below the second hysteresis threshold until the second qualification timer times out.

14. A method according to claim 11, wherein the current buffer is stopped from storing further digital data samples after a time delay after the pulse trailing edge is detected in the data samples being stored in the current buffer.

15. A method according to claim 11, further comprising storing information relating a particular extracted pulse.

16. A method according to claim 15, wherein said information relating to a particular pulse includes at least timing information and memory address information.

17. A method according to claim 15, wherein said information relating to a particular pulse includes at least a pulse number, the pulse numbers being incremented each time a new pulse is extracted.

18. A method according to claim 17, further comprising receiving control information for controlling the memory buffers to store only predetermined pulses according to their pulse number.

19. A method according to claim 11, wherein the data is stored in the at least two memory buffers in a time-multiplexed manner.

* * * * *